US008064275B2

(12) United States Patent
Houston et al.

(10) Patent No.: US 8,064,275 B2
(45) Date of Patent: Nov. 22, 2011

(54) LOCAL SENSING AND FEEDBACK FOR AN SRAM ARRAY

(75) Inventors: Theodore W. Houston, Richardson, TX (US); Hugh T. Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 71 days.

(21) Appl. No.: 12/499,666

(22) Filed: Jul. 8, 2009

(65) Prior Publication Data

US 2011/0007580 A1   Jan. 13, 2011

(51) Int. Cl.
*G11C 7/06* (2006.01)
(52) U.S. Cl. .................... 365/189.15; 365/228
(58) Field of Classification Search ............. 365/189.15, 365/228
See application file for complete search history.

(56) References Cited

U.S. PATENT DOCUMENTS 6,442,060 B1* 8/2002 Leung et al. ............ 365/154
2004/0085841 A1* 5/2004 Lim et al. ............... 365/203
* cited by examiner

*Primary Examiner* — Hoai V Ho
*Assistant Examiner* — Jay Radke
(74) *Attorney, Agent, or Firm* — Rose Alyssa Keagy; Wade J. Brady, III; Frederick J. Telecky, Jr.

(57) ABSTRACT

An integrated circuit having an SRAM array includes SRAM cells arranged in rows and columns, and a global read circuit connected to globally read SRAM cells corresponding to accessed rows and columns of the SRAM array. The SRAM array also includes a separate, local sense and feedback circuit connected to a local column of the SRAM array, wherein a sensing portion indicates a memory state of an SRAM cell in an accessed row of the local column and a feedback portion rewrites the memory state back into the SRAM cell. Additionally, a method of operating an integrated circuit having an SRAM array includes providing an SRAM cell in an addressed condition of the SRAM array. The method also includes locally sensing a current memory state of the SRAM cell and locally feeding back to the SRAM cell to retain the memory state during the addressed condition.

19 Claims, 8 Drawing Sheets

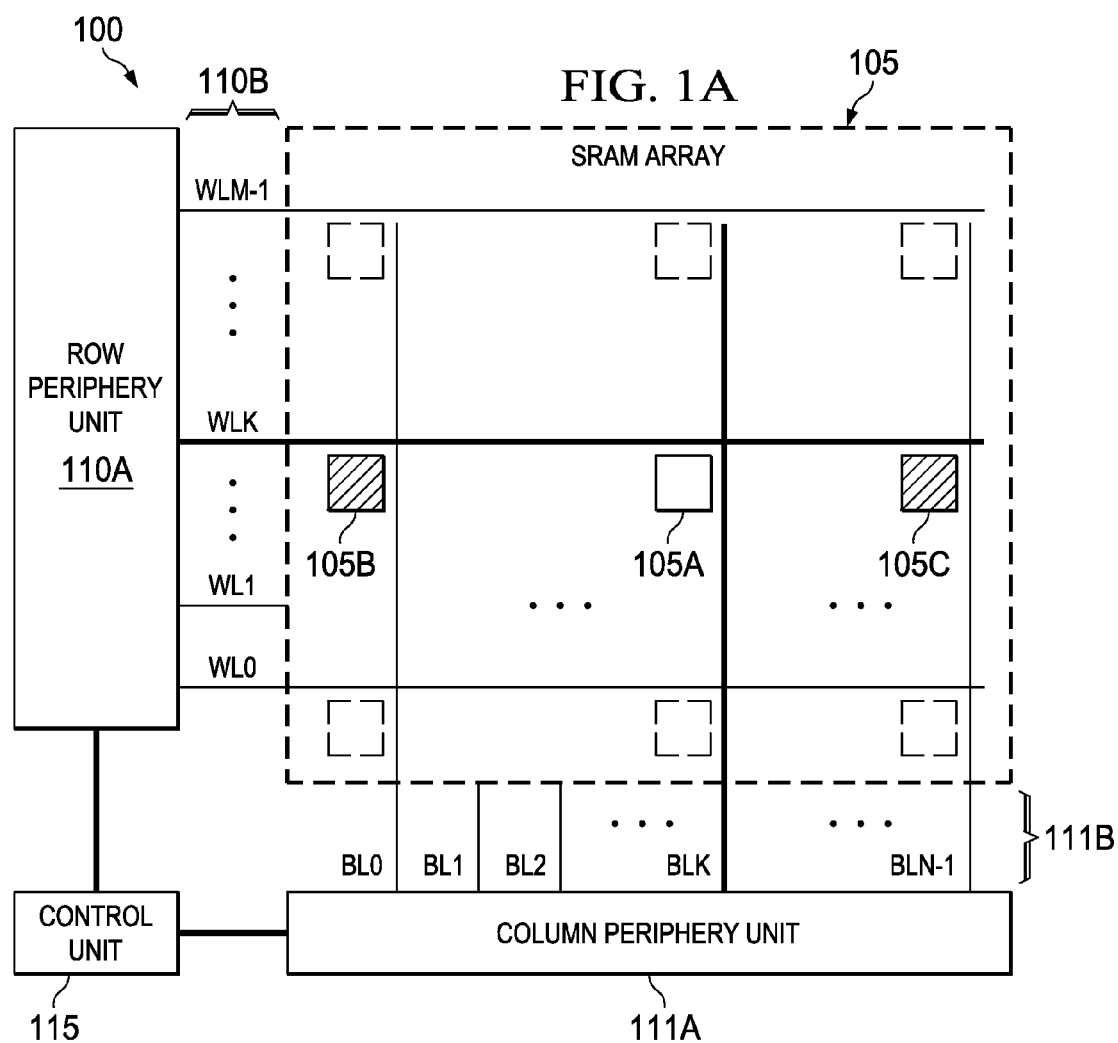

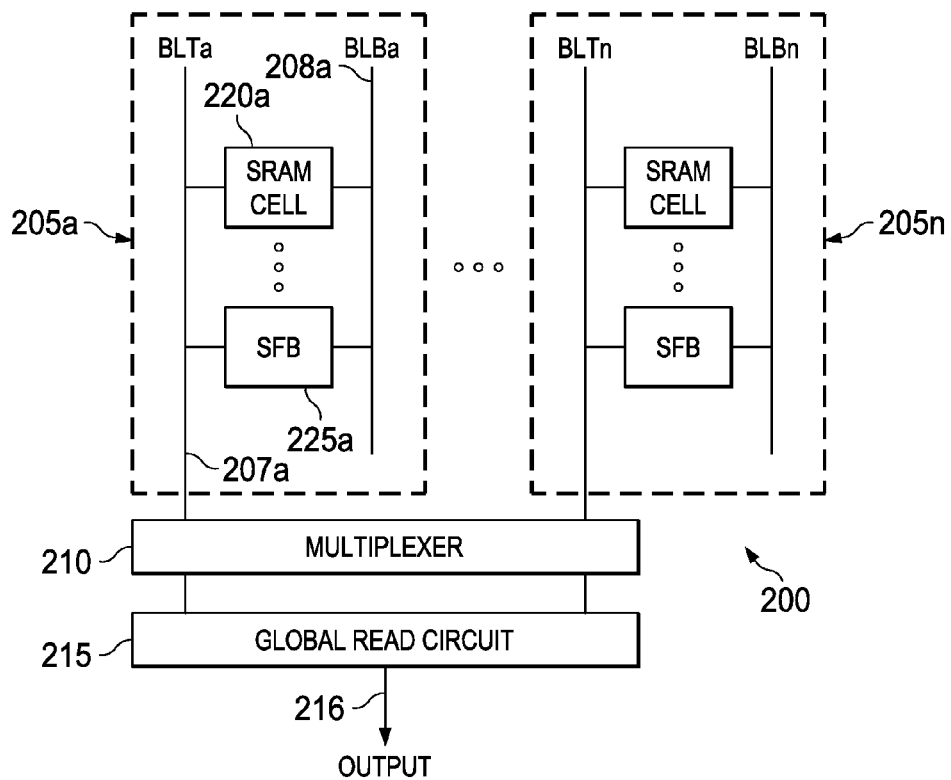
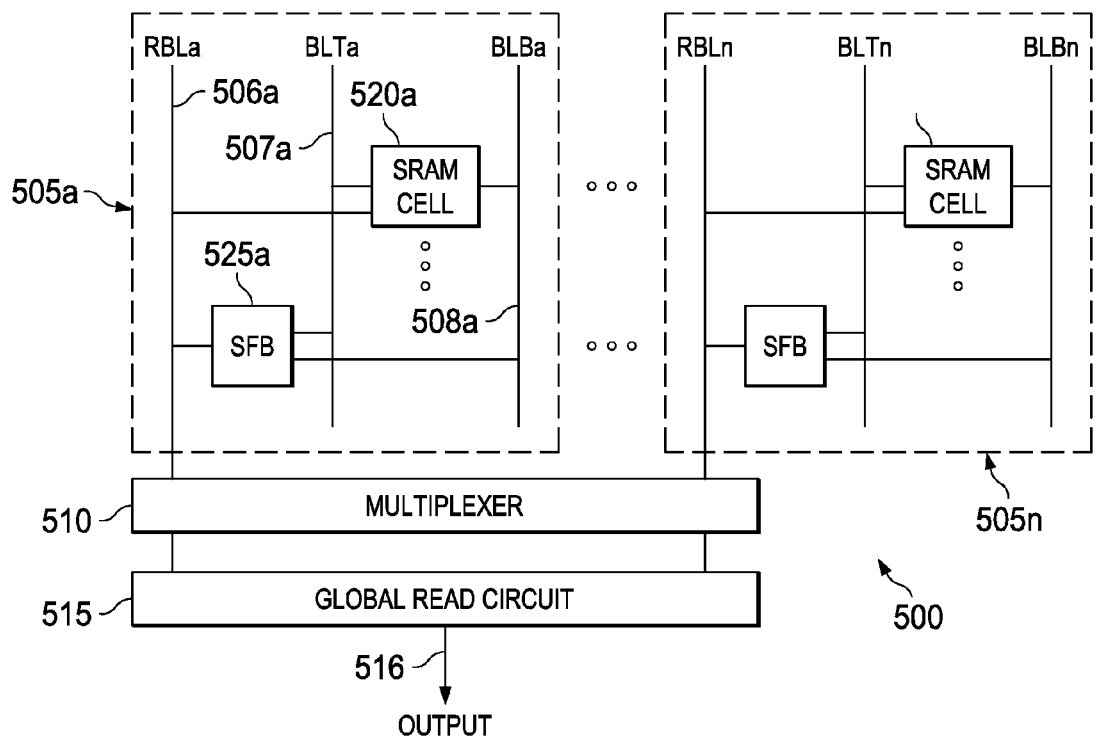

US 8,064,275 B2

LOCAL SENSING AND FEEDBACK FOR AN SRAM ARRAY

TECHNICAL FIELD

This application is directed, in general, to an integrated circuit and, more specifically, to an integrated circuit that includes a static random access memory (SRAM) array, a method of operating an integrated circuit having an SRAM array and a method of reducing an operating power of an integrated circuit having an SRAM array.

BACKGROUND

A typical SRAM device is designed to store many thousands of bits of information. These bits are stored in individual cells, organized in an array of rows and columns to make efficient use of space on a semiconductor substrate containing the SRAM device. Commonly used cell architecture is known as the "6T" cell, by virtue of having a structure consisting of six MOS transistors. Four transistors defining an SRAM cell core or memory element are configured as cross-coupled CMOS inverters, which act as a bistable circuit that can indefinitely hold a memory state imposed on it, while powered. Each CMOS inverter includes a load or "pull-up" transistor and a driver or "pull-down" transistor. The outputs of the two inverters will be in opposite states, except during transitions from one state to another.

Two additional transistors are known as pass gate transistors, which provide access to the cross-coupled inverters during a read operation or a write operation. The gate inputs of the pass gate transistors are typically commonly connected to a word line for row access. The pass gate transistors are used to respectively connect each side of the memory element to a "true" bit line BLT and its complement (or "bar") bit line BLB for column access. In SRAMs having interleaved words in a row, half-addressed cells (those residing in non-selected columns in a selected row) are subject to upset when fully-addressed cells are being written. This can limit the assist given to writing into the cell (e.g., using a boosted word line signal for write).

Some SRAM cell architectures, such as a 7T or 8T SRAM cell architecture, include a read buffer that isolates the storage element during a read operation. Nevertheless, half-addressed cells in a write cycle are subject to upset. Read and write-back is one approach that can be used to preserve the state of half-addressed cells in a write cycle. However, using read and write-back often comes at the expense of considerable dynamic power. Improvements in this area would prove beneficial in the art.

SUMMARY

Embodiments of the present disclosure provide an integrated circuit having a static random access memory (SRAM) array, a method of operating an integrated circuit having an SRAM array and a method of reducing an operating power of an integrated circuit having an SRAM array. In one embodiment, the SRAM array includes SRAM cells arranged in rows and columns, and a global read circuit connected to globally read SRAM cells corresponding to accessed rows and columns of the SRAM array. The SRAM array also includes a separate, local sense and feedback circuit connected to a local column of the SRAM array, wherein a sensing portion indicates a memory state of an SRAM cell in an accessed row of the local column and a feedback portion rewrites the memory state back into the SRAM cell.

In another aspect, the method of operating an integrated circuit having an SRAM array includes providing an SRAM cell in an addressed condition of the SRAM array. The method also includes locally sensing a current memory state of the SRAM cell and locally feeding back to the SRAM cell to retain the current memory state during the addressed condition.

In yet another aspect, the method of reducing an operating power of an integrated circuit having an SRAM array includes providing global read and write operations for the SRAM array. The method also includes locally sensing an SRAM cell in an addressed condition of the SRAM array to provide a reduced-power indication of a memory state relative to the global read operation of the SRAM array. The method further includes locally feeding back to the SRAM cell in the addressed condition to provide a reduced-power rewrite of the memory state relative to the global write operation of the SRAM array.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which:

FIG. 1A illustrates a block diagram of an integrated circuit that includes a static random access memory (SRAM) employing local sense and feedback circuits constructed according to the principles of the present disclosure;

FIG. 2 illustrates an example of a portion of a global read circuit as may be employed in the hierarchical bit line structure of FIG. 1B;

FIG. 5 illustrates a diagram of a plurality of blocks of SRAM cells employing another embodiment of a local sense and feedback circuit as may be employed in a hierarchical bit line structure such as that of FIG. 1B;

DETAILED DESCRIPTION

Figure 1B:
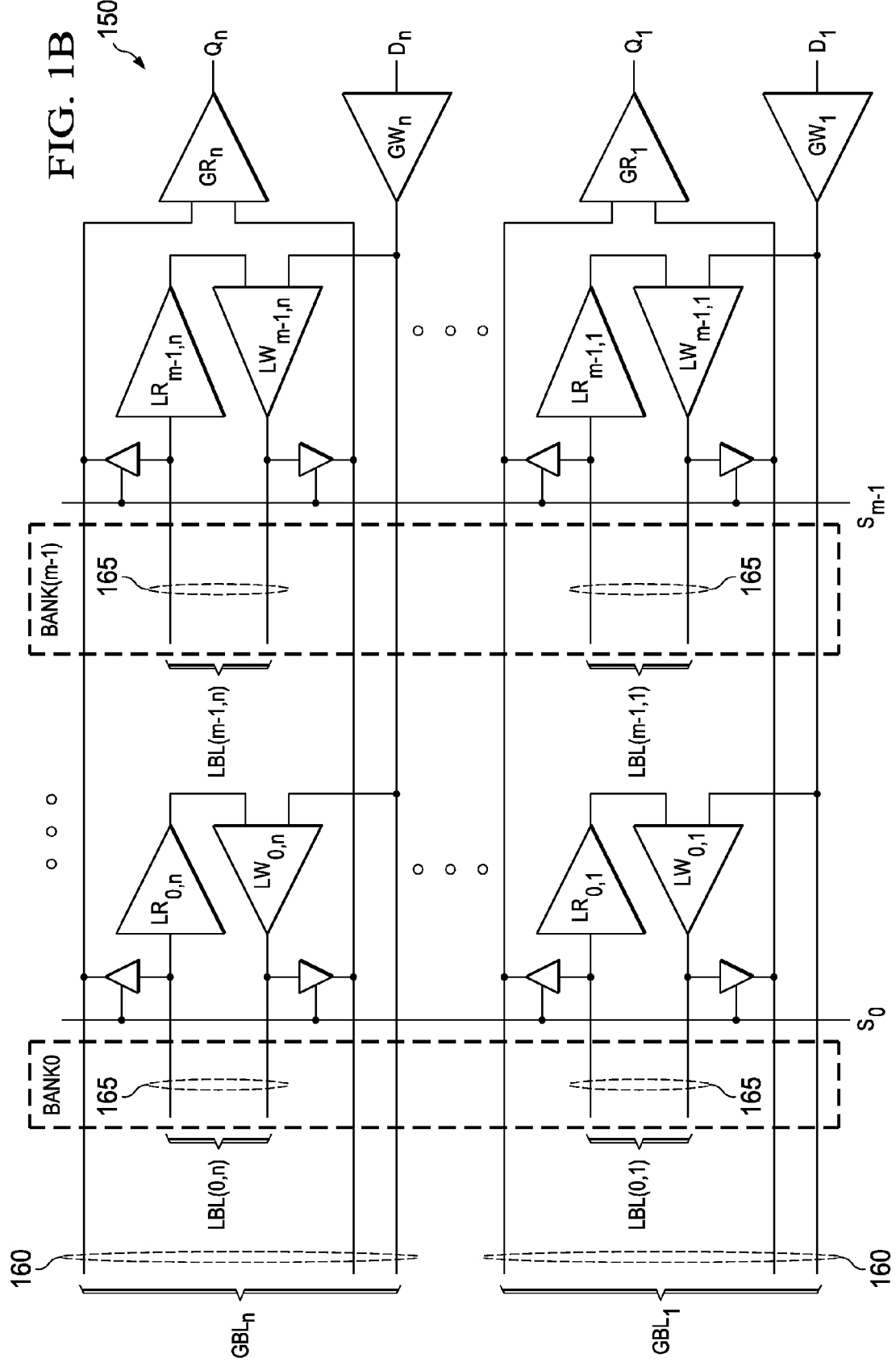
FIG. 1B illustrates a block diagram showing a hierarchical bit line structure of local and global bit lines as may be employed in the SRAM array of FIG. 1A.

Read and write-back is an option to allow a more robust write in SRAM arrays. Read and write-back requires a global reading on every column in an accessed row. A standard architecture of SRAM arrays is to have relatively large sense amplifiers that are multiplexed among several columns (e.g., four columns). Having these large sense amplifiers on every column produces a severe requirement with regard to array area and power consumption. Driving all column bit lines during the write-back operation is also a severe requirement with respect to power consumption.

Embodiments of the present disclosure recognize that in a read and write-back cycle, a full global read and write-back are not needed. It is only necessary to sense the contents of the half-addressed SRAM cells, wherein this information is not provided as an output from the SRAM array as during a global read operation. Feeding back this information to the half-addressed SRAM cell to avoid upset does not require driving the bit lines as strongly as in a write operation needed for the fully-addressed cells. Additionally, a timing of feeding back this information to avoid SRAM cell upset may also be more relaxed than is the timing required for a global read and write-back operation. Thus, embodiments of the present disclosure provide local sensing and feeding back capabilities as differentiated from a global read and write or write-back operation.

FIG. 1A illustrates a block diagram of an integrated circuit that includes a static random access memory (SRAM), generally designated 100, employing local sense and feedback circuits constructed according to the principles of the present disclosure. In general, embodiments of the SRAM 100 may be included in the integrated circuit as an embedded memory connected to other portions of the integrated circuit. Alternatively, the SRAM 100 may be a discrete memory contained in the integrated circuit.

The SRAM 100 includes an SRAM array 105, a row periphery unit 110A, a column periphery unit 111A and a control unit 115. The SRAM array 105 is organized in corresponding rows and columns, as shown. The SRAM array 105 is connected to the row periphery unit 110A by M sets of word lines 110B (i.e., WL0 through WLM-1). Each of the M sets of word lines 110B is controlled by word line drivers to provide access to a row of memory cells in the SRAM array 105.

The SRAM array 105 is also connected to the column periphery unit 111A by N sets of bit lines 111B (i.e., BL0 through BLN-1). Each of the N sets of bit lines 111B provides access to a column of a plurality of SRAM cell blocks in the SRAM array 105. The control unit 115 is connected to the row and column periphery units 110A, 111A and controls their respective operations.

In the illustrated example, one of a set of word lines WLK and a set of bit lines BLK are addressed. This action places a plurality of memory cells that are in an accessed row of the SRAM array 105 in an addressed condition. The plurality of memory cells 105A is in a fully-addressed condition. Correspondingly, this action also places other pluralities of memory cells (105B and 105C, for example) in a half-addressed condition, since the sets of bit lines BL0 and BLN-1 are not addressed.

Embodiments of a set of separate, local sense and feedback circuits may be employed with the memory cells in the addressed condition to locally sense and feedback their respective memory states to counteract upsetting the plurality of memory cells. In each of the local sense and feedback circuits, a sensing portion indicates a memory state of an SRAM cell in the accessed row of its column, and a feedback portion rewrites the memory state back into the SRAM cell. In one embodiment, the SRAM cell may be in a half-addressed condition. In another embodiment, the SRAM cell may be in a fully-addressed condition.

For the purposes of this disclosure, the term "read" may be taken to mean a global acquiring of memory states from SRAM cells that are to be output from the SRAM array 105. Conversely, the term "sense" may be taken to mean a local indication of memory states that are generally not to be output from the SRAM array 105.

Additionally, the terms "write" or "write-back" may be taken to mean a global impression of memory states on SRAM cells that requires bit line swings of at least sufficient magnitude to overcome current memory states. Conversely, the terms "feedback" "feeding back" or "rewrite" may be taken to mean a local impression of memory states on SRAM cells that only requires a bit line swing of sufficient magnitude to avoid or override any tendency for the memory cells to upset, which generally is less than the magnitude needed to perform a write or a write-back.

FIG. 1B illustrates a block diagram showing a hierarchical bit line structure, generally designated 150, of global and local bit lines as may be employed in the SRAM 100 of FIG. 1A. In the illustrated embodiment, the hierarchical bit line structure 150 includes N sets of global bit lines 160 (also designated $GBL_1$-GBLn) that correspond to an M×N matrix of local bit lines 165 (also designated as LBL(0,1)-LBL(m-1,n)).

The N sets of global bit lines $GBL_1$-GBLn are accessed through global read circuits $GR_1$-GRn and global write circuits $GW_1$-GWn, respectively. The global read circuits $GR_1$-GRn provide global read signals Q1-Qn, and the global write circuits $GW_1$-GWn receive global write signals D1-Dn, as shown. Each set of the global bit lines $GBL_1$-GBLn corresponds to M sets of local bit lines LBL(0,1)-LBL(m-1,1) through LBL(0,n)-LBL(m-1,n), as shown. Each of the M sets of local bit lines LBL(0,1)-LBL(0,n) through LBL(m-1,1)-LBL(m-1,n) is accessed by local read circuits $LR_{0,1}$-$LR_{0,n}$ through $LR_{m-1,n}$-$LR_{m-1,n}$, and local write circuits $LW_{0,1}$-$LW_{0,n}$ through $LW_{m-1,1}$-$LW_{m-1,n}$ as respectively selected by the control signals $S_0$-$S_{m-1}$ that are applied on a mutually exclusive basis. Each set of local bit lines in the M×N matrix of local bit lines LBL(0,1)-LBL(m-1,n) includes a separate local sense and feedback circuit (not shown in FIG. 1B), as discussed below.

FIG. 2 illustrates an example of a portion of global read circuitry, generally designated 200, as may be employed in the hierarchical bit line structure 150 of FIG. 1B. The portion 200 includes a plurality of SRAM cell blocks 205a-205n that are connected through a multiplexer 210 to a global read circuit 215. The global read circuit 215 is connected to a global read bit line 216, which forms a portion of a global read capability.

An SRAM cell block 205a, corresponding to a local column, includes multiple SRAM cells of which an SRAM cell 220a is typical. Also included are local bit lines 207a, 208a, which are "true" and "complement" bit lines BLTa, BLBa and a sense and feedback circuit (SFB) 225a. The SRAM cell block 205a is typical of each of the plurality of SRAM cell blocks 205a-205n.

The true bit line BLTa serves to provide a memory state corresponding to the SRAM cell 220a being read, when fully-addressed, as provided through the multiplexer 210 to the global read circuit 215 for a global read. The true and complement bit lines BLTa, BLBa serve to provide a memory state being written into the SRAM cell 220a for a global write (not explicitly shown in FIG. 2).

Alternatively, the true bit line BLTa also serves as a local bit line for sensing the local column represented by the SRAM cell block 205a. A sensing portion of the sense and feedback circuit 225a is driven to indicate a memory state of the SRAM cell 220a, when it is in an accessed row of the local column (e.g., in a half-addressed condition). A feedback portion of the sense and feedback circuit 225a then rewrites the memory state back into the SRAM cell 220a employing the complement bit line BLBb, which serves as a local bit line for feeding back the memory state. The portion 200 provides a structure wherein the sensing portion is connected to a single local read bit line, and the feedback portion is connected to a single local write bit line.

Figure 3A:
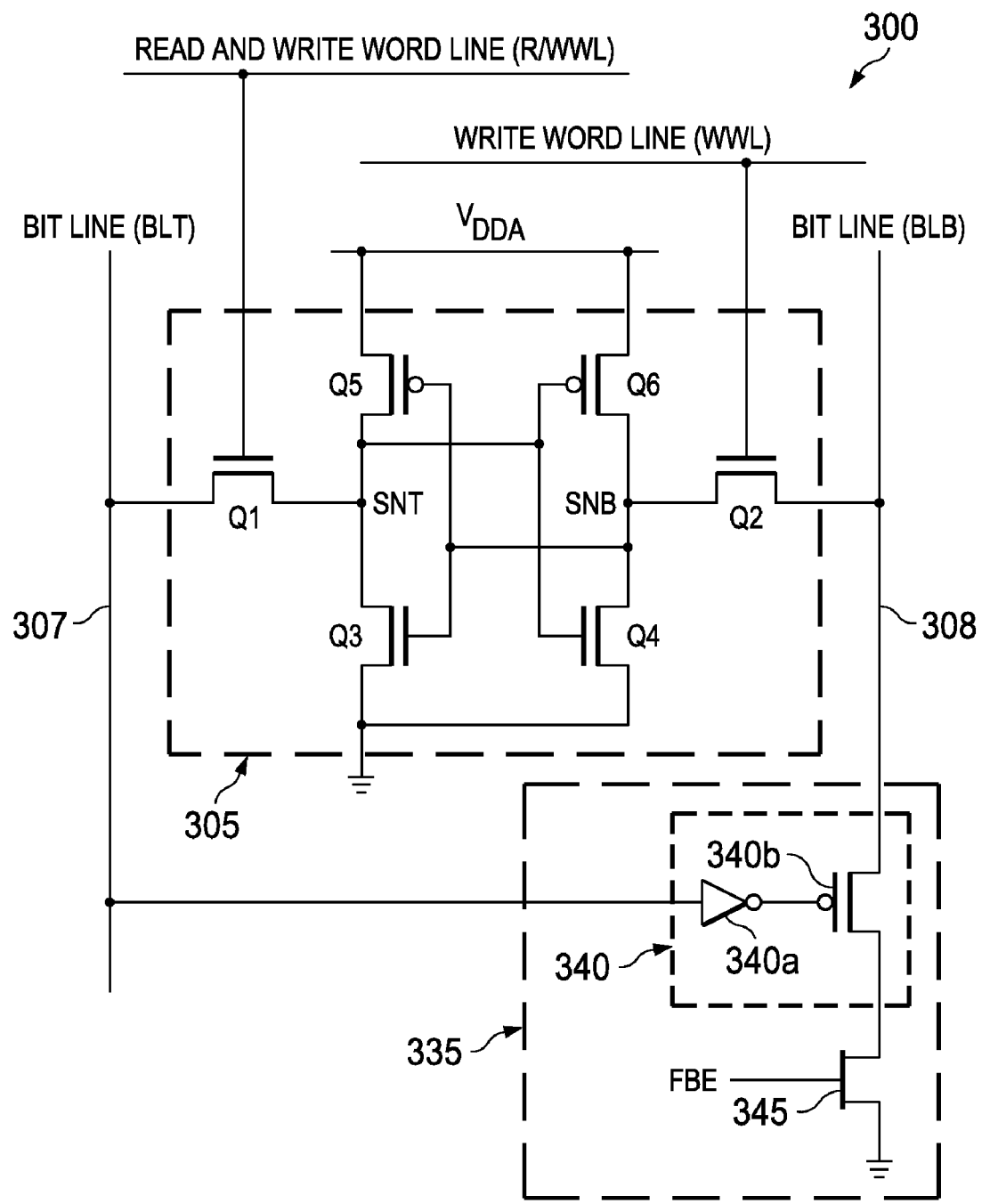
FIGS. 3A and 3B illustrate diagrams of SRAM memory cells employing embodiments of local sense and feedback circuits constructed according to the principles of the present disclosure.
Figure 3B:
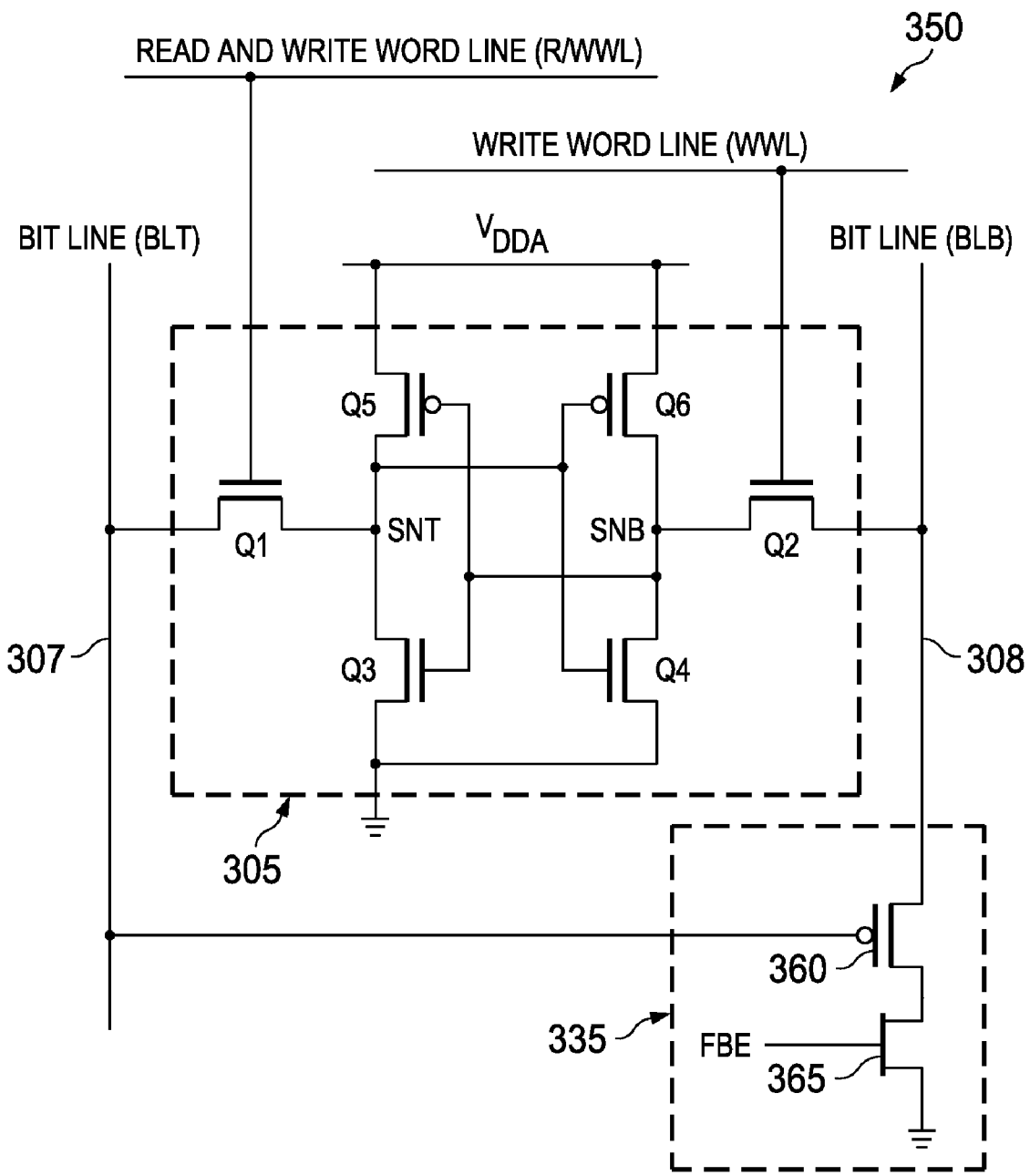

FIGS. 3A and 3B illustrate diagrams of SRAM cells employing embodiments of local sense and feedback circuits, generally designated 300 and 350 and constructed according to the principles of the present disclosure. FIGS. 3A and 3B provide more specific examples for the structure as generally discussed with respect to FIG. 2.

FIGS. 3A and 3B include a six-transistor (6T) SRAM cell 305 employing a read and write word line (R/WWL), a write word line (WWL) and local bit lines 307, 308 as first and second bit lines BLT, BLB. FIGS. 3A and 3B also include alternative embodiments of local sense and feedback circuits 335, 355, respectively.

The 6T SRAM cell 305 includes left/right NMOS pass gate transistors Q1/Q2, left/right NMOS driver transistors Q3/Q4, and left/right PMOS load transistors Q5/Q6. The 6T SRAM cell 305 provides left/right storage nodes SNT and SNB (where T stands for True and B stands for "Bar" or complement, as before) for storing a bit state. The first and second bit lines BLT, BLB provide respective access to the left/right storage nodes SNT, SNB.

The left/right NMOS pass gate transistors Q1/Q2 are controlled by the two different word lines R/WWL and WWL, respectively. Activation of the R/WWL controls single-sided reading from the left storage node SNT of the 6T SRAM cell 305. Activation of both the R/WWL and WWL control two-sided writing to the 6T SRAM cell 305.

The local sense and feedback circuit 335 corresponds to a local column of an SRAM array and includes sensing and feedback portions 340 employing a sensing inverter 340a and a feedback transistor 340b. The local sense and feedback circuit 335 also includes a feedback control switch 345. The sensing inverter 340a indicates a memory state of the 6T SRAM cell 305 when it is in a half-addressed condition. That is, when the R/WWL is activated to provide access to the left storage node SNT through the left NMOS pass gate transistors Q1, and the WWL is activated to provide access to the right storage node SNB through the right NMOS pass gate transistors Q2.

The sensing inverter 340a provides the complement of the memory state from the first bit line BLT to the feedback transistor 340b. The feedback transistor 340b may then influence the second storage node SNB through the second bit line BLB to rewrite the memory state back into the half-addressed addressed 6T SRAM cell 305 when the feedback control switch 345 is activated by a feedback-enable control signal FBE.

Assume that the 6T SRAM cell 305 is in a half-addressed condition with both the R/WWL and WWL activating the left/right NMOS pass gate transistors Q1/Q2, respectively. If the left storage node SNT is HIGH, (Q3 is not conducting or "OFF" and Q4 is conducting or "ON"), the feedback transistor 340b provides a conductive path to ground for the second bit line BLB when the feedback-enable control signal FBE activates the feedback control switch 345. This action rewrites the current memory state back into the 6T SRAM cell 305 thereby causing it to retain its current memory value.

If the left storage node SNT is LOW (Q3 is conducting or "ON" and Q4 is not conducting or "OFF"), the feedback transistor 340b does not provide a conductive path to ground for the second bit line BLB, which has been pre-charged HIGH, under any condition of the feedback control switch 345. The left driver transistor Q3 being ON also assists in keeping the first bit line BLT LOW. These actions also rewrite the current memory state back into the 6T SRAM cell 305 thereby causing it to retain its current memory value.

The local sense and feedback circuit 355 includes a feedback transistor 360 and a feedback control switch 365 that is controlled by a feedback-enable control signal FBE. If the left storage node SNT is HIGH, the feedback transistor 360 provides a conductive path to ground for the second bit line BLB when the feedback-enable control signal FBE activates the feedback control switch 365. This action rewrites the current memory state back into the 6T SRAM cell 305 thereby causing it to retain its current memory value.

If the left storage node SNT is LOW, the feedback transistor 360 does not provide a conductive path to ground for the second bit line BLB, which has been pre-charged HIGH, under any condition of the feedback control switch 365. The left driver transistor Q3 being ON also assists in the keeping the first bit line BLT LOW, as before. These actions rewrite the current memory state back into the 6T SRAM cell 305 thereby causing it to retain its current memory value.

As discussed above, rewriting the current memory state for the 6T SRAM cell 305 is dependent on the timing of the feedback-enable control signal FBE under some storage node conditions. This timing may be independently chosen to prevent upset of the 6T SRAM cell 305 when it is in the half-addressed condition.

Figure 4:
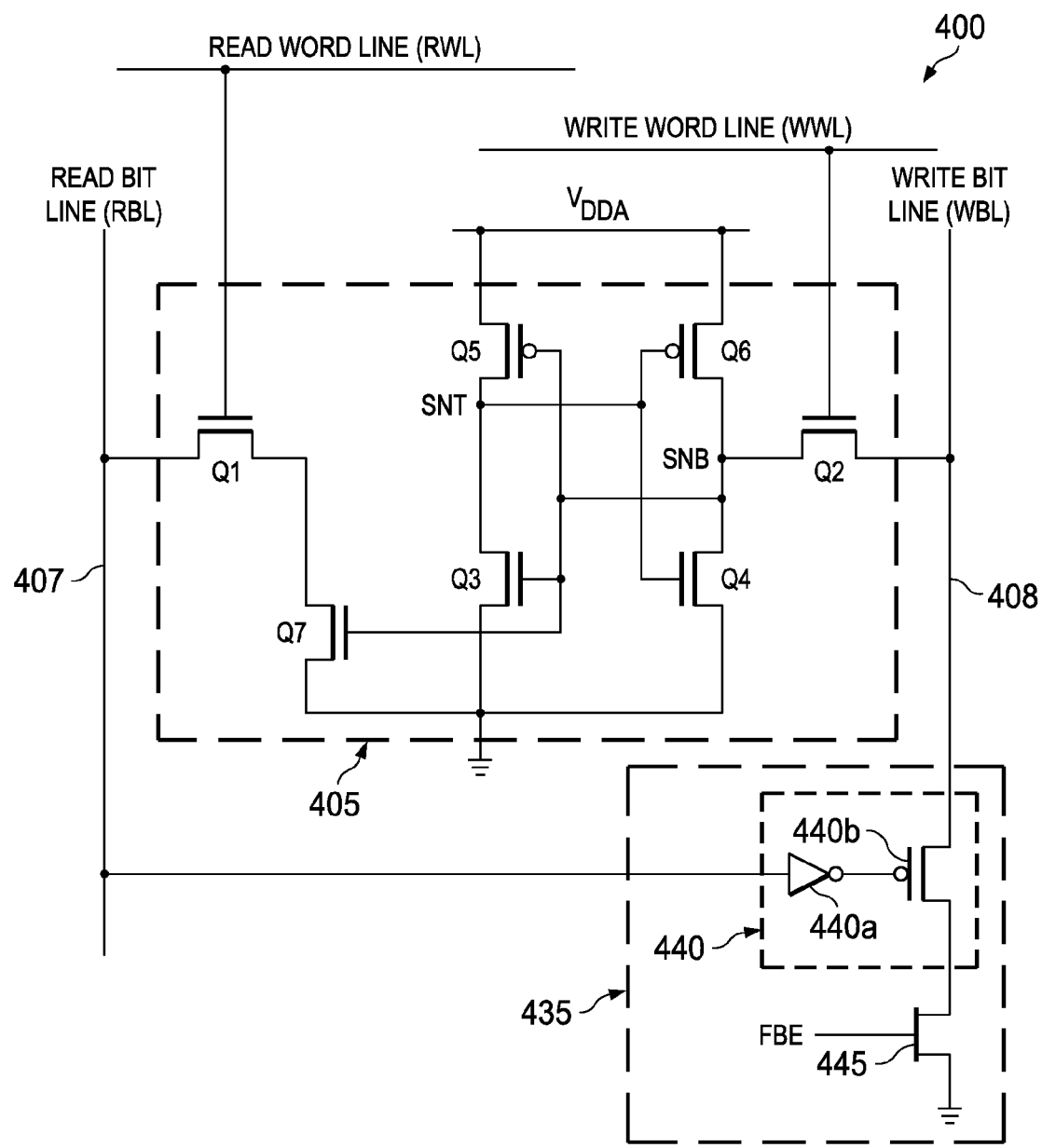
FIG. 4 illustrates a diagram of a seven transistor (7T) SRAM cell employing an embodiment of a local sense and feedback circuit constructed according to the principles of the present disclosure.

FIG. 4 illustrates a diagram of a seven transistor (7T) SRAM cell employing an embodiment of a local sense and feedback circuit, generally designated 400, constructed according to the principles of the present disclosure. FIG. 4 provides another specific example for the structure representing a local column as generally discussed with respect to FIG. 2. FIG. 4 includes a 7T SRAM cell 405 that is connected to a read word line (RWL), a write word line (WWL), a local read bit line (local RBL) 407 and a local write bit line (local WBL) 408. The 7T SRAM cell is also connected to an embodiment of a local sense and feedback circuit 435.

The 7T SRAM cell 405 includes left/right NMOS pass gate transistors Q1/Q2, left/right NMOS driver transistors Q3/Q4, left/right PMOS load transistors Q5/Q6 and a read-isolation transistor Q7. The 7T SRAM cell 405 provides left/right storage nodes SNT, SNB for storing a bit state, as before. The 7T SRAM cell 405 employs both a single-sided read and a single-sided write during normal memory functioning wherein the local RBL 407 provides the single-sided read capability and the local WBL 408 provides the single-sided write capability with access to the right storage node SNB.

In the illustrated embodiment, the local sense and feedback circuit 435 corresponds to a local column of an SRAM array and includes sensing and feedback portions 440 employing a sensing inverter 440a and a feedback transistor 440b, as before. The local sense and feedback circuit 435 also includes a feedback control switch 445 that is activated by a feedback-enable control signal FBE, as shown.

If the left storage node SNT is HIGH, the feedback transistor 440b provides a conductive path to ground for the local WBL 408 when the feedback-enable control signal FBE activates the feedback control switch 345. This action rewrites the current memory state back into the 7T SRAM cell 405 thereby causing it to retain its current memory value. If the left storage node SNT is LOW, the feedback transistor 440b does not provide a conductive path to ground for the local WBL 408, which has been pre-charged HIGH, under any condition of the feedback control switch 445. The read-isolation transistor Q7 being ON also assists in keeping the local RBL 407 LOW. These actions rewrite the current memory state back into the 7T SRAM cell 405 thereby causing it to retain its current memory value.

FIG. 5 illustrates a diagram of a plurality of blocks of SRAM cells, generally designated 500, employing another embodiment of a local sense and feedback circuit as may be employed in a hierarchical bit line structure such as that of FIG. 1B. Each block of SRAM cells represents a local column as may be employed in the SRAM array 100 wherein a single local sense and feedback circuit is connected between three local bit lines, as shown. A structure is illustrated in FIG. 5 wherein a sensing portion is connected to a single local read bit line, and a feedback portion is connected to a pair of complementary local write bit lines.

The plurality of SRAM cell blocks 505a-505n is connected through a multiplexer 510 to a global read circuit 515. The global read circuit 515 is connected to a global read bit line 516, which forms a portion of a global read capability. In this embodiment, local sense and feedback circuits are connected to a single local read bit line, as before. Alternatively, the local sense and feedback circuits are connected to first and second complementary local write bit lines, as shown.

An SRAM cell block 505a, corresponding to a local column, includes multiple SRAM cells (of which SRAM cell 520a is typical), a local read bit line (local RBLa) 506a, first and second complementary local write bit lines (complementary local WBLs) 507a, 508a and a sense and feedback circuit (SFB) 525a. The SRAM cell block 505a is typical of each of the plurality of SRAM cell blocks 505a-505n.

The local RBLa 506a serves to provide a memory state corresponding to the SRAM cell 520a being read, when fully-addressed, as provided through the multiplexer 510 to the global read circuit 515 for a global read. The first and second complementary local WBLs 507a, 508a serve to provide for a memory state being written into the SRAM cell 520a for a global write (not explicitly shown in FIG. 5).

Alternatively, the local RBLa 506a also serves as a local bit line for sensing the local column represented by the SRAM cell block 505a. A sensing portion of the sense and feedback circuit 525a is driven to indicate a memory state of the SRAM cell 520a, when it is in an accessed row of the local column (e.g., when it is in a half-addressed condition). A feedback portion of the sense and feedback circuit 525a then rewrites the memory state back into the SRAM cell 520a employing the first and second complementary local WBLs 507a, 508a which serve as local bit lines for feeding back the memory state.

Figure 6:
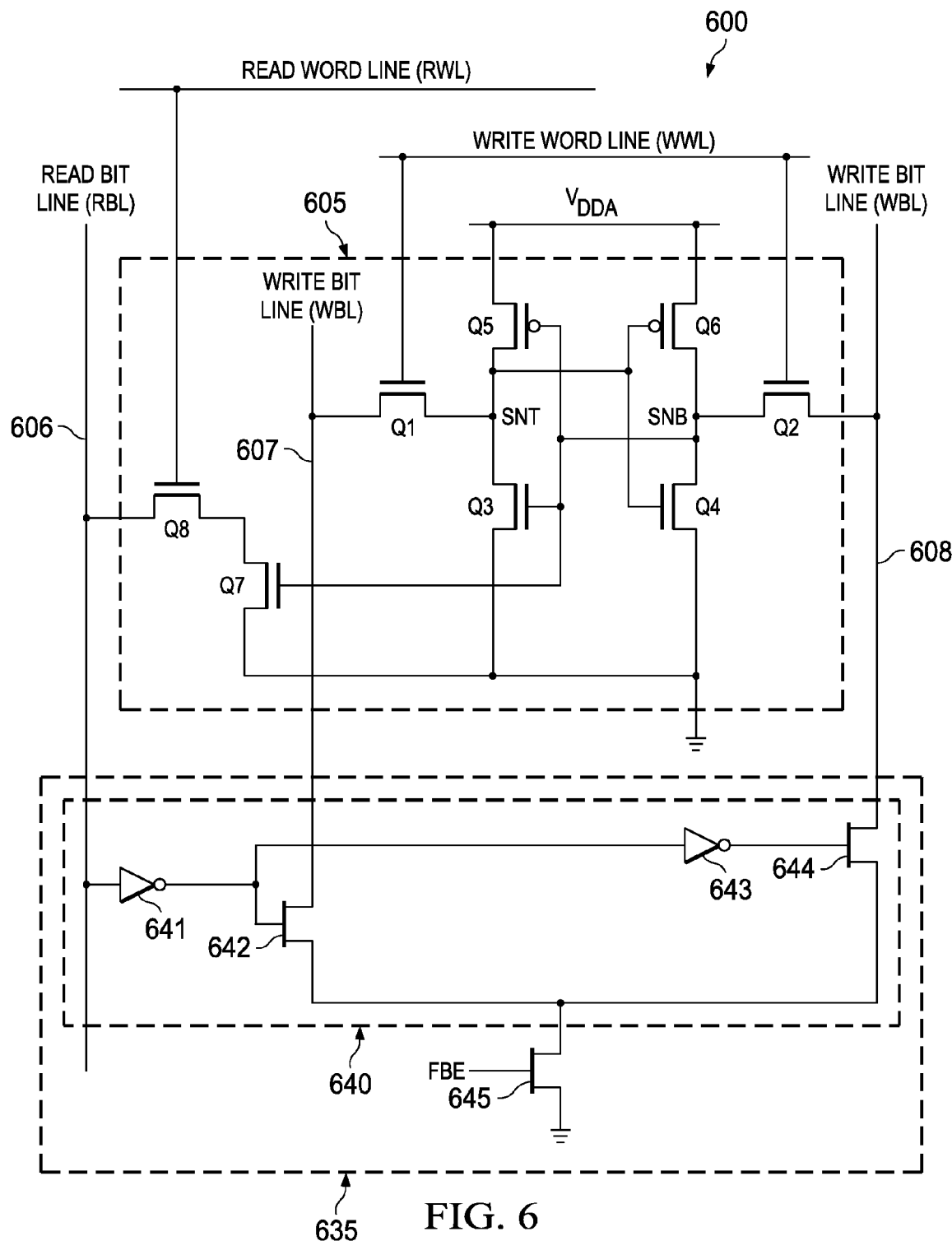
FIG. 6 illustrates a diagram of an eight transistor (8T) SRAM cell employing another embodiment of a local sense and feedback circuit constructed according to the principles of the present disclosure.

FIG. 6 illustrates a diagram of an eight transistor (8T) SRAM cell employing another embodiment of a local sense and feedback circuit, generally designated 600, constructed according to the principles of the present disclosure. FIG. 6 is representative of the structure as generally discussed with respect to FIG. 5 and includes an 8T SRAM cell 605 employing a read word line (RWL), a write word line (WWL), a local read bit line (local RBL) 606 and first and second complementary local write bit lines (WBLs) 607, 608. The 8T SRAM cell 605 is also connected to an embodiment of a local sense and feedback circuit 635.

The 8T SRAM cell 605 includes left/right NMOS write pass gate transistors Q1/Q2, left/right NMOS driver transistors Q3/Q4, left/right PMOS load transistors Q5/Q6, a read-isolation transistor Q7 and a read pass gate transistor Q8. The 8T SRAM cell 605 provides left/right storage nodes SNT, SNB for storing a bit state, as before. The 8T SRAM cell 605 employs a single-sided read and double-sided write during normal memory functioning wherein the local RBL 606 provides the single-sided read capability and the first and second complementary local WBLs 607, 608 provide the double-sided write capability. Functionally, operation of the 8T SRAM cell 605 parallels that of a 6T SRAM cell with an added advantage that a read operation is buffered from the left storage node SNT.

In the illustrated embodiment, the local sense and feedback circuit 635 corresponds to a local column of an SRAM array and includes sensing and feedback portions 640 employing first and second sensing inverters 641, 643 and first and second feedback transistors 642, 644. The local sense and feedback circuit 635 also includes a feedback control switch 645 that is activated by a feedback-enable control signal FBE, as shown.

The first sensing inverter 641 and first feedback transistor 642 and the second sensing inverter 643 and second feedback transistor 644 provide complementary feedback signals to the first and second complementary local WBLs 607, 608, which are initially precharged HIGH. If the left storage node SNT is HIGH, the second feedback transistor 644 provides a conductive path to ground for the second complementary local WBL 608 when the feedback-enable control signal FBE activates the feedback control switch 645 during a half-addressed condition of the 8T SRAM cell 605. This action rewrites the current memory state back into the 8T SRAM cell 605 thereby causing it to retain its current memory value.

If the left storage node SNT is LOW, the first feedback transistor 642 provides a conductive path to ground for the first complementary local WBL 607 when the feedback-enable control signal FBE activates the feedback control switch 645. This action rewrites the current memory state back into the 8T SRAM cell 605 thereby causing it to retain its current memory value.

Figure 7:
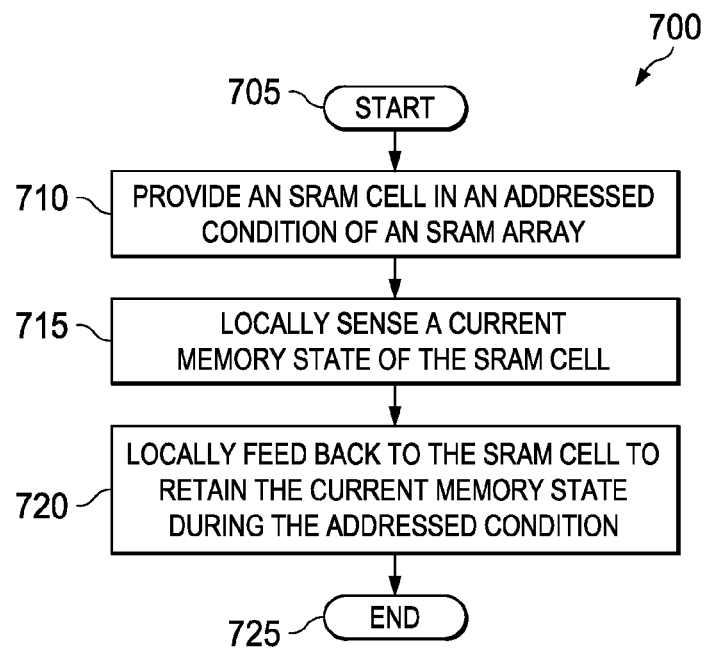
FIG. 7 illustrates a flow diagram of an embodiment of a method of operating an integrated circuit carried out according to the principles of the present disclosure.

FIG. 7 illustrates a flow diagram of an embodiment of a method of operating an integrated circuit, generally designated 700, carried out according to the principles of the present disclosure. The method 700 is used with an SRAM array in the integrated circuit and starts in a step 705. Then, in a step 710, an SRAM cell is provided in an addressed condition of the SRAM array. Locally sensing a current memory state of the SRAM cell in the addressed condition is accomplished in a step 715. Locally feeding back to the SRAM cell to retain the current memory state is accomplished during the addressed condition, in a step 720.

Generally, the locally sensing and feeding back are provided with local bit lines that are shared by a block of SRAM cells, wherein the locally sensing and feeding back are provided separately from global reading and writing of the SRAM cell. Additionally, the locally feeding back is controlled by a feedback-enable control signal.

In one embodiment, the locally sensing is provided with a single local read bit line and the locally feeding back is provided with a single local write bit line. In another embodiment, the locally sensing is provided with a single local read bit line and the locally feeding back is provided with a pair of complementary local write bit lines. The method 700 ends in a step 725.

Figure 8:
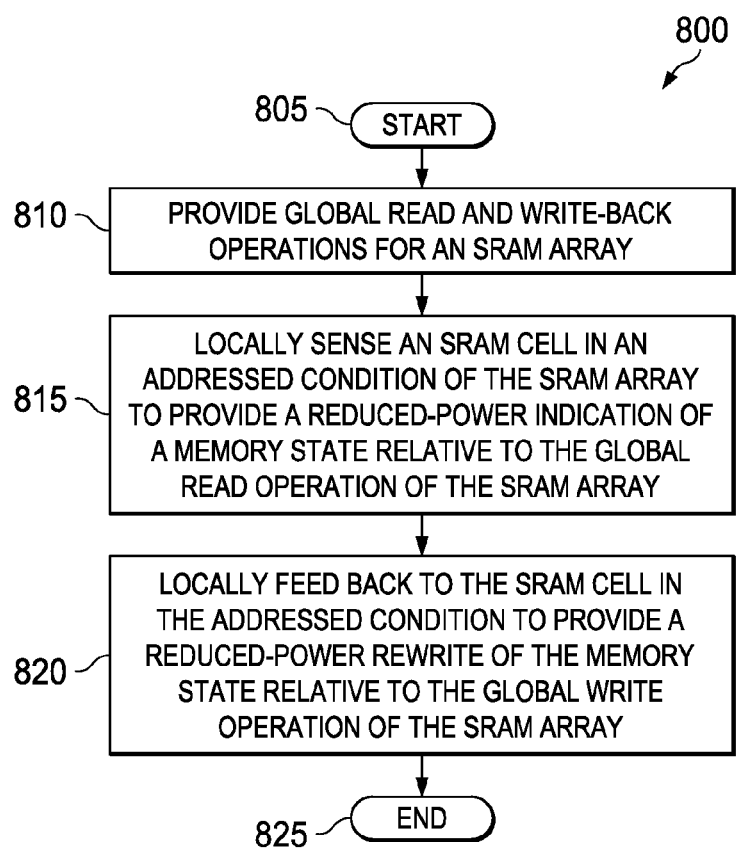
FIG. 8 illustrates a flow diagram of an embodiment of a method of reducing an operating power of an integrated circuit carried out according to the principles of the present disclosure.

FIG. 8 illustrates a flow diagram of an embodiment of a method of reducing an operating power of an integrated circuit, generally designated 800, carried out according to the principles of the present disclosure. The method 800 is used with an SRAM array in the integrated circuit and starts in a step 805. Then, in a step 810, global read and write operations for the SRAM array are provided. In a step 815, an SRAM cell in an addressed condition of the SRAM array is locally sensed to provide a reduced-power indication of a memory state relative to the global read operation of the SRAM array. And, in a step 820, the reduced-power indication is locally fed back to the SRAM cell in the addressed condition to provide a reduced-power rewrite of the memory state relative to the global write operation of the SRAM array.

Generally, providing the reduced-power indication and rewrite of the memory state corresponds to a single block of SRAM cells, wherein providing the reduced-power indication and rewrite of the memory state is controlled by a feedback-enable control signal. In one embodiment, providing the reduced-power indication and rewrite of the memory state employs at least two local bit lines of the single block of SRAM cells. The method 800 ends in a step 825.

Those skilled in the art to which this application relates will appreciate that other and further additions, deletions, substitutions and modifications may be made to the described embodiments.

What is claimed is:

1. An integrated circuit having a static random access memory (SRAM) array, the SRAM array comprising:
    SRAM cells arranged in rows and columns;
    a global read circuit connected to globally read SRAM cells corresponding to accessed rows and columns of the SRAM array; and
    a local sense and feedback circuit separately connected to a local column of the SRAM array, wherein a sensing portion indicates a memory state of an SRAM cell in an accessed row of the local column independently of the global read, and a feedback portion rewrites the memory state back into the SRAM cell.

2. The integrated circuit as recited in claim 1 wherein the local column corresponds to local bit lines of a block of SRAM cells.

3. The integrated circuit as recited in claim 2 wherein the sensing and feedback portions are series-connected between the local bit lines of the block of SRAM cells.

4. The integrated circuit as recited in claim 1 wherein the sensing portion is connected to provide the complement of a sensed local bit line.

5. The integrated circuit as recited in claim 1 wherein the feedback portion is connected to provide the complement of a sensed local bit line.

6. The integrated circuit as recited in claim 1 wherein the feedback portion is controlled by a feedback-enable control signal.

7. The integrated circuit as recited in claim 1 wherein the feedback portion is connected to a single local bit line.

8. The integrated circuit as recited in claim 1 wherein the feedback portion is connected to a pair of complementary local bit lines.

9. The integrated circuit as recited in claim 1 wherein the sensing portion is connected to a single local read bit line and the feedback portion is connected to a single local write bit line.

10. The integrated circuit as recited in claim 1 wherein the sensing portion is connected to a single local read bit line and the feedback portion is connected to a pair of complementary local write bit lines.

11. A method of operating an integrated circuit having a static random access memory (SRAM) array, comprising:
    providing an SRAM cell in an addressed condition of the SRAM array;
    locally sensing a current memory state of the SRAM cell using local sense circuitry; and
    locally feeding back to the SRAM cell to retain the current memory state during the addressed condition using local feedback circuitry;
    wherein the locally sensing and feeding back are provided separately from global reading and writing of the SRAM cell.

12. The method as recited in claim 11 wherein the locally sensing and feeding back are provided with local bit lines that are shared by a block of SRAM cells.

13. The method as recited in claim 11 wherein the locally feeding back is controlled by a feedback-enable control signal.

14. The method as recited in claim 11 wherein the locally sensing is provided with a single local read bit line and the locally feeding back is provided with a single local write bit line.

15. The method as recited in claim 11 wherein the locally sensing is provided with a single local read bit line and the locally feeding back is provided with a pair of complementary local write bit lines.

16. A method of reducing an operating power of an integrated circuit having an SRAM array, comprising:
    providing global read and write operations for the SRAM array;
    locally sensing an SRAM cell in an addressed condition of the SRAM array to provide a reduced-power indication of a memory state relative to the global read operation of the SRAM array; and
    locally feeding back to the SRAM cell in the addressed condition to provide a reduced-power rewrite of the memory state relative to the global write operation of the SRAM array.

17. The method as recited in claim 16 wherein providing the reduced-power indication and rewrite of the memory state corresponds to a single block of SRAM cells.

18. The method as recited in claim 17 wherein providing the reduced-power indication and rewrite of the memory state employs at least two local bit lines of the single block of SRAM cells.

19. The method as recited in claim 16 wherein providing the reduced-power indication and rewrite of the memory state is controlled by a feedback-enable control signal.

* * * * *